United States Patent
Liu et al.

(10) Patent No.: US 10,049,986 B2
(45) Date of Patent: Aug. 14, 2018

(54) PACKAGE STRUCTURES AND METHODS OF MAKING THE SAME

(71) Applicant: Taiwan Semiconductor Manufacturing Company, Ltd., Hsin-Chu (TW)

(72) Inventors: Zi-Jheng Liu, Hsin-Chu (TW); Chung-Shi Liu, Hsin-Chu (TW); Hung-Jui Kuo, Hsin-Chu (TW); Yu-Hsiang Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/928,803

(22) Filed: Oct. 30, 2015

(65) Prior Publication Data

US 2017/0125346 A1    May 4, 2017

(51) Int. Cl.
| | |
|---|---|
| *H01L 21/00* | (2006.01) |
| *H01L 23/538* | (2006.01) |
| *H01L 21/762* | (2006.01) |
| *H01L 21/768* | (2006.01) |
| *H01L 23/522* | (2006.01) |
| *H01L 23/00* | (2006.01) |
| *H01L 21/56* | (2006.01) |

(52) U.S. Cl.
CPC ........ *H01L 23/5384* (2013.01); *H01L 21/762* (2013.01); *H01L 21/76895* (2013.01); *H01L 23/5226* (2013.01); *H01L 23/5386* (2013.01); *H01L 24/19* (2013.01); *H01L 24/20* (2013.01); *H01L 21/568* (2013.01); *H01L 2224/04105* (2013.01); *H01L 2224/12105* (2013.01); *H01L 2224/16227* (2013.01); *H01L 2224/24137* (2013.01); *H01L 2224/32225* (2013.01); *H01L 2224/73267* (2013.01); *H01L 2224/92244* (2013.01); *H01L 2225/1029* (2013.01); *H01L 2924/141* (2013.01); *H01L 2924/143* (2013.01); *H01L 2924/1431* (2013.01); *H01L 2924/1432* (2013.01); *H01L 2924/1434* (2013.01); *H01L 2924/1436* (2013.01); *H01L 2924/19041* (2013.01); *H01L 2924/19042* (2013.01); *H01L 2924/19043* (2013.01)

(58) Field of Classification Search
CPC .......................... H01L 23/3185; H01L 24/19
USPC ........................................................ 438/107
See application file for complete search history.

(56) References Cited

U.S. PATENT DOCUMENTS

| | | | | |
|---|---|---|---|---|
| 5,532,090 A | * | 7/1996 | Borodovsky | G03F 7/2022 430/322 |
| 6,943,124 B1 | * | 9/2005 | Lu | G03F 7/11 438/725 |
| 2015/0179616 A1 | * | 6/2015 | Lin | H01L 25/50 257/773 |

* cited by examiner

*Primary Examiner* — Hsin-Yi Hsieh
(74) *Attorney, Agent, or Firm* — Slater Matsil, LLP

(57) ABSTRACT

A package structure and method of making the same is provided. A through via is formed on a substrate, the through via extending through a molding material. An upper surface of the molding material is recessed from an upper surface of the through via. A dielectric layer is deposited over the through via and the molding material. The dielectric layer has a first upper surface with a first variation in height between a first area disposed over the through via and a second area disposed over the molding material. Exposure processes are performed on the dielectric layer. The dielectric layer is developed. After the developing, the dielectric layer has a second upper surface with a second variation in height between the first area and the second area. The first variation is greater than the second variation.

20 Claims, 10 Drawing Sheets

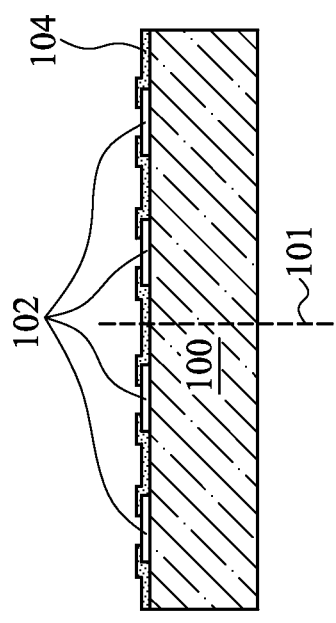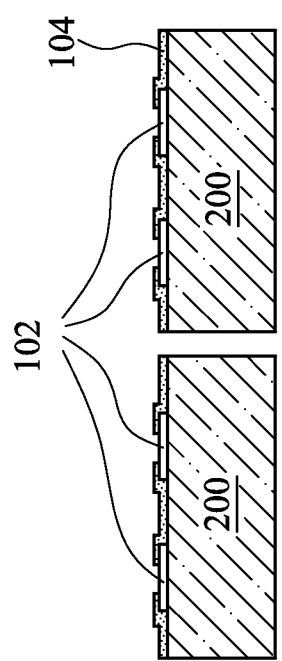

PACKAGE STRUCTURES AND METHODS OF MAKING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DIC wherein dies are packaged and are then packaged together with another packaged die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 to 8 are cross sections of intermediate stages in the making of package structures in accordance with some embodiments.

DETAILED DESCRIPTION OF ILLUSTRATIVE EMBODIMENTS

Figure 3:
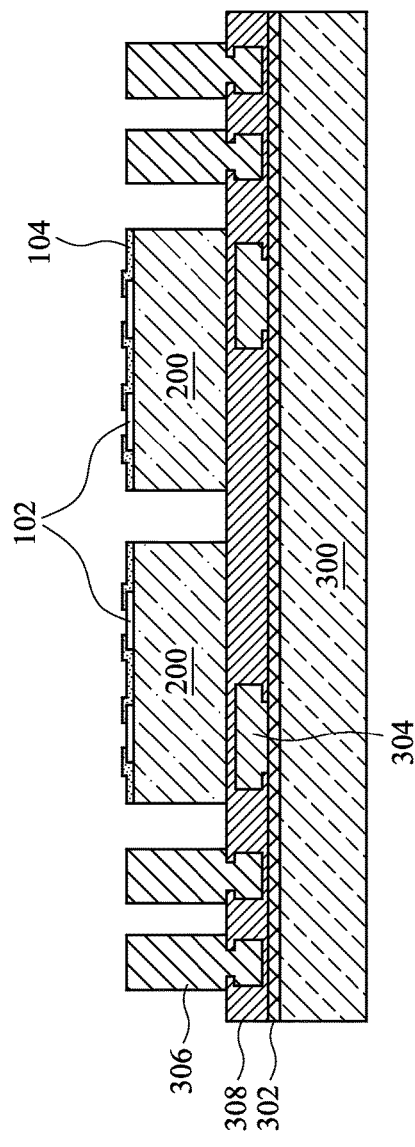

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely packages comprising dies and through vias, with one or more layers of redistribution lines disposed in one or more dielectric layers overlying the dies and the through vias. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

An Integrated Fan-Out ("InFO") package, including dies and through vias, and methods of forming the same are provided in accordance with various exemplary embodiments. The intermediate stages of forming the InFO package are illustrated and variations of embodiments are discussed.

FIGS. 1-8 illustrate cross-sectional views of intermediate steps in forming a semiconductor package in accordance with some embodiments. Referring first to FIG. 1, there is shown a wafer 100. Wafer 100 may comprise one or more integrated circuit dies, as indicated by the dotted line 101 separating adjacent integrated dies. The integrated circuit dies may include any die suitable for a particular application. For example, wafer 100 may include one or more static random access memory (SRAM) chips or dynamic random access memory (DRAM) chips, processors, memory chips, logic chips, analog chips, digital chips, central processing units (CPUs), graphics processing units (GPUs), or a combination thereof, or the like.

Wafer 100 may be may be processed according to applicable manufacturing processes to form integrated circuits in the wafer 100. Wafer 100 may include contact pads 102 on a top surface of the wafer 100. Contact pads 102 may enable external electrical connections to the wafer 100. For example, contact pads 102 may be electrically coupled to devices such as transistors (not shown) in the wafer 100, and contact pads 102 may enable external electrical connections to the devices.

A buffer layer 104 is formed over the wafer 100. Buffer layer 104 is a dielectric layer, which may be a polymer (such as polybenzoxazole (PBO), polyimide, benzocyclobutene (BCB), or the like), a nitride (such as silicon nitride or the like), an oxide (such as silicon oxide, PhosphoSilicate Glass (PSG), BoroSilicate Glass (BSG), Boron-doped Phospho-Silicate Glass (BPSG), or a combination thereof, or the like), or the like, and may be formed, for example, by spin coating, lamination, Chemical Vapor Deposition (CVD), or the like. In some embodiments, buffer layer 104 has a uniform thickness, wherein the thickness may be between about 0.1 µm to about 5 µm, such as about 1 µm.

Buffer layer 104 may be patterned to expose contact pads 102. In some embodiments, buffer layer 104 may be patterned by a photolithography process. For example, a patterned photoresist layer (not shown) may be deposited and patterned, wherein openings in the mask layer expose the desired pattern in the buffer layer 104. An etch step is performed to remove the exposed portions of buffer layer and expose contact pads 102, wherein the etching may be an anisotropic etching. The portions of buffer layer 104 that are overlapped by the patterned photoresist layer, on the other hand, remain not etched. The openings in buffer layer 104 may have a width of about 5 µm to about 100 µm, such as about 50 µm. Next, the mask layer may be removed, for example in an ashing and/or wet strip process. In some embodiments, buffer layer 104 is a photosensitive material and may be patterned in a photolithography process without the need for an additional photoresist layer to be deposited over buffer layer 104.

Referring to FIG. 2, wafer 100 may be singulated into a plurality of individual integrated circuit dies 200. Although FIG. 2 depicts wafer 100 being singulated into two individual dies 200, more or less dies are possible, depending on the particular approach.

Turning to FIG. 3, integrated circuit dies 200 are placed on a carrier substrate 300. Generally, the carrier substrate 300 provides temporary mechanical and structural support during subsequent processing steps. The carrier substrate 300 may include any suitable material, such as, for example, silicon based materials, such as a silicon wafer, glass or silicon oxide, or other materials, such as aluminum oxide, a ceramic material, combinations of any of these materials, or the like. In some embodiments, the carrier substrate 300 is planar in order to accommodate further processing.

Release layer 302 is an optional layer formed over the carrier substrate 300 that may allow easier removal of the carrier substrate 300. As explained in greater detail below, various layers and devices are placed over the carrier substrate 300, after which the carrier substrate 300 may be removed. The optional release layer 302 aids in the removal of the carrier substrate 300, reducing damage to the structures formed over the carrier substrate 300. The release layer 302 may be formed of a polymer-based material. In some embodiments, the release layer 302 is an epoxy-based thermal release material, which loses its adhesive property when heated, such as a Light-to-Heat-Conversion (LTHC) release coating. In other embodiments, the release layer 302 may be an ultra-violet (UV) glue, which loses its adhesive property when exposed to UV light. The release layer 302 may be dispensed as a liquid and cured. In other embodiments, the release layer 302 may be a laminate film laminated onto the carrier substrate 300. Other release layers may be utilized.

One or more backside redistribution layers (RDLs) 308 are formed over release layer 302. Generally, RDLs provide a conductive pattern that allows a pin-out contact pattern for a completed package different than the pattern of through vias 306 (discussed below), allowing for greater flexibility in the placement of through vias 306. The backside RDLs 308 may be utilized to provide an external electrical connection to through vias 306. The backside RDLs 308 comprise one or more dielectric layers having conductive lines 304 therein. Conductive lines 304 may extend along any direction.

The backside RDLs 308 may be formed using any suitable process. For example, in some embodiments, a dielectric layer is formed on the release layer 302 and carrier substrate 300. In some embodiments, the dielectric layer is formed of a polymer, which may be a photo-sensitive material such as polybenzoxazole (PBO), polyimide, benzocyclobutene (BCB), or the like, that may be patterned using lithography. In other embodiments, the dielectric layer is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. The dielectric layer may be formed by spin coating, lamination, CVD, the like, or a combination thereof. The dielectric layer is then patterned to form openings to expose any sections that are intended to be used for external connection. In embodiments in which the dielectric layer is formed of a photo-sensitive material, the patterning may be performed by exposing the dielectric layer in accordance with a desired pattern and developed to remove the unwanted material, thereby exposing the desired area. Other methods, such as using a patterned mask and etching, may also be used to pattern the dielectric layer.

A seed layer (not shown) is formed over the dielectric layer and in the openings formed in the dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A mask is then formed and patterned on the seed layer in accordance with a desired redistribution pattern, such as the pattern illustrated in FIG. 3. In some embodiments, the mask is a photoresist formed by spin coating or the like and exposed to light for patterning. The patterning forms openings through the mask to expose the seed layer. A conductive material is formed in the openings of the mask and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive lines 304. A second dielectric layer is formed over the first dielectric layer to provide a more planar surface for subsequent layers and may be formed using similar materials and processes as used to form the first dielectric layer. In some embodiments, the second dielectric layer is formed of polymer, a nitride, an oxide, or the like. In some embodiments, the second dielectric layer is PBO formed by a spin-on process.

In accordance with some embodiments, through vias ("TVs") 306 are formed over RDLs 308. The TVs 306 provide an electrical connection from one side of the package to another side of the package. For example, as will be explained in greater detail below, a molding compound will be formed around the through vias and the die. Subsequently, another device, such as another die, package, substrate, or the like, may be attached to the dies and the molding compound. The through vias 306 provide an electrical connection between the another device and the backside of the package, including backside RDLs 308, without having to pass electrical signals through the integrated circuit dies 200.

The through vias 306 may be formed, for example, by forming a conductive seed layer (not shown) over the backside RDLs 308. In some embodiments, the seed layer is a metal layer, which may be a single layer or a composite layer comprising a plurality of sub-layers formed of different materials. The seed layer may be made of copper, titanium, nickel, gold, or a combination thereof, or the like. In some embodiments, the seed layer comprises a titanium layer and a copper layer over the titanium layer. The seed layer may be formed using, for example, physical vapor deposition (PVD), CVD, atomic layer deposition (ALD), a combination thereof, or the like. In some embodiments, the seed layer comprises a titanium layer and a copper layer over the titanium layer. In alternative embodiments, the seed layer is a copper layer.

A mask layer, such as a patterned photoresist layer, may be deposited and patterned, wherein openings in the mask layer expose the seed layer. The openings may be filled with a conductive material using, for example, an electroless plating process or an electrochemical plating process, thereby creating metal features over the seed layer. The plating process may uni-directionally fill the openings (e.g., from the seed layer upwards) in the patterned photoresist layer. Uni-directional filling may allow for more uniform filling of such openings. Alternatively, another seed layer may be formed on sidewalls of the openings in the patterned photoresist layer, and such openings may be filled multi-directionally. The metal features may comprise copper, aluminum, tungsten, nickel, solder, or alloys thereof. The top-view shapes of the metal features may be rectangles, squares, circles, or the like. The heights of the metal features are determined by the thickness of the integrated circuit dies 200, with the heights of the metal features being about equal to the thickness of dies 200 in some embodiments.

Next, the mask layer may be removed, for example in an ashing and/or wet strip process. An etch step is performed to remove the exposed portions of the seed layer, wherein the etching may be an anisotropic etching. The portions of the seed layer that are overlapped by the metal features, on the other hand, remain not etched. The metal features and the remaining underlying portions of the seed layer form the TVs 306. When the seed layer is formed of a material similar to or the same as the respective overlying metal features, the seed layer may be merged with the metal features with no distinguishable interface between. In some embodiments, there exist distinguishable interfaces between the seed layer and the overlying metal features. The TVs 306 can also be realized with metal wire studs placed by a wire bonding process, such as a copper wire bonding process. The use of a wire bonding process may eliminate the need for depositing the seed layer, depositing and patterning a mask layer, and plating to form the TVs 306.

In some embodiments the integrated circuit dies 200 may be placed on the backside RDLs 308 beside the TVs 306, on an opposite side of the backside RDLs 308 from the carrier substrate 300. In some embodiments, integrated circuit dies 200 may be adhered to the backside RDLs 308 by an adhesive layer, such as a die-attach film (DAF) (not shown). A thickness of the adhesive layer may be in a range from about 5 μm to about 50 μm, such as about 10 um.

Figure 4:
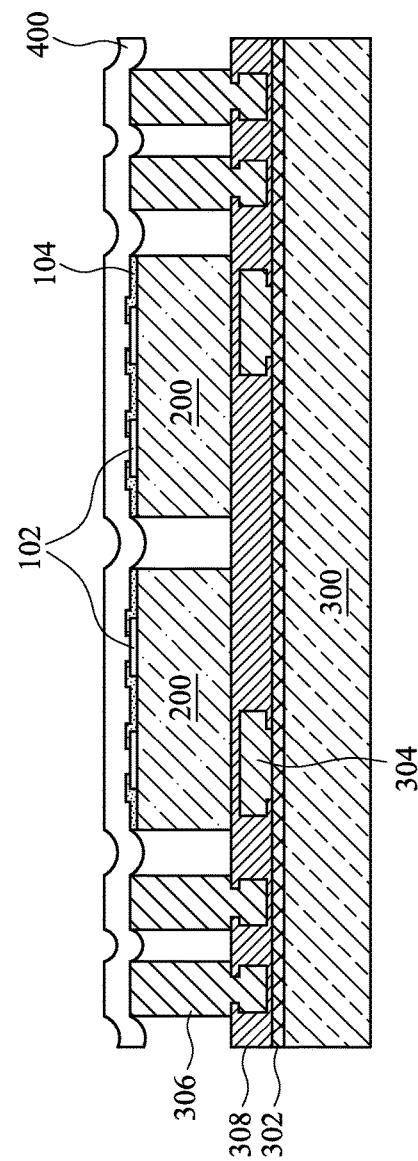

Referring to FIG. 4, a release layer 400 is disposed over the tops of TVs 306 and dies 200. As will be described in greater detail below, a molding material will be molded into the spaces between dies 200 and TVs 306. Release layer 400 is used to confine the molding material to gaps between TVs 306 and dies 200, and to ensure that the molding material does not extend above the top surfaces of TVs 306 and dies 200. In some embodiments, release layer 400 is pliable such that portions of the release layer 400 not directly over either a die 200 or a TV 306 may extend into the gaps between the dies 200 and the TVs 306. In some embodiments, release layer 400 is a polymer (such as polybenzoxazole (PBO), polyimide, benzocyclobutene (BCB), or the like). In some embodiments, release layer 400 is a polymer dry film, and may be disposed over the TVs 306 and dies 200 by laminating, sticking, rolling down, or the like. After being disposed over dies 200 and TVs 306, force may be applied to an upper surface of release layer 400 to ensure there are no gaps between release layer 400 and the underlying TVs 306 or dies 200.

Figure 5:
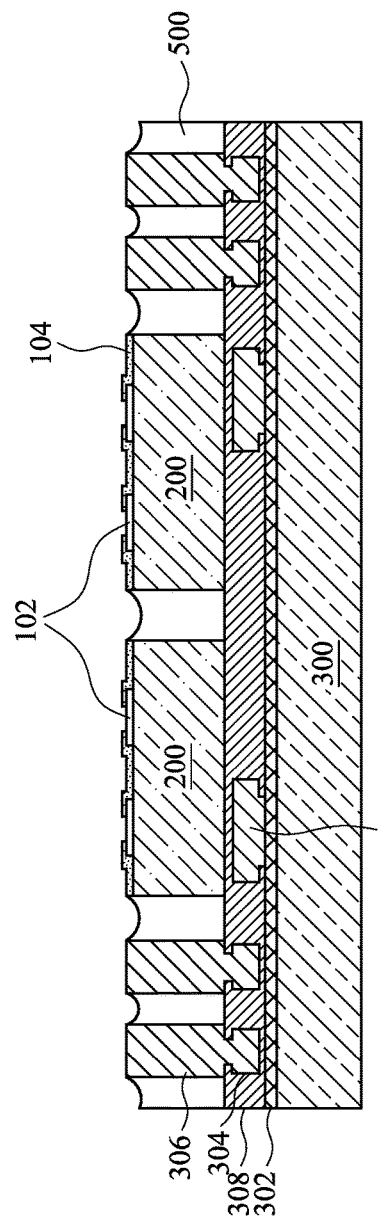

Referring to FIG. 5, a molding material 500 is molded along sidewalls of dies 200 and TVs 306. Molding material 500 fills the gaps between dies 200 and TVs 306, and may be in contact with backside RDLs 308. Molding material 500 may include a molding compound, a molding underfill, an epoxy, or a resin. The molding material 500 is molded onto the structure from the sides of the structure, in light of the barriers formed by the backside of the package and the release layer 400. After the molding process, the release layer 400 is removed. For example, in the case of release layer 400 comprising a polymer dry film, release layer 400 may be removed by physically pulling the layer off. The resulting structure is depicted in FIG. 5. Because of the pliable release layer 400, portions of which extended below the top surfaces of TVs 306 and dies 200 into the gaps between, the upper surfaces of molding material 500 may not be planar, and may follow the outline of the bottom surface of the release layer 400 that was removed (see FIG. 4).

Figure 6:
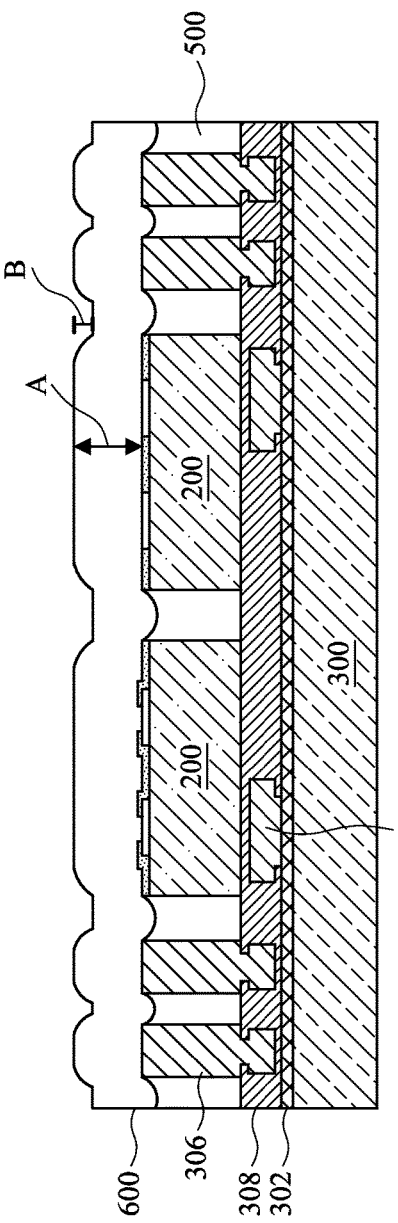

Referring to FIG. 6, a dielectric layer 600 is formed over molding material 500, dies 200, and TVs 306. In some embodiments, dielectric layer 600 is formed of a polymer, which may be a photo-sensitive material such as polybenzoxazole (PBO), polyimide, benzocyclobutene (BCB), or the like, that may be patterned using lithography. The dielectric layer may be formed by lamination, CVD, the like, or a combination thereof. In some embodiments, dielectric layer 600 may have a thickness A of about 5 μm to about 30 μm, such as 17 μm. Because of the non-planar nature of the molding material 500, dies 200 and TVs 306, the upper surface of dielectric layer 600 may have variations in height when using some deposition techniques, such as a conformal deposition process. For example, the upper surface of dielectric layer 600 may have one or more peaks located over the tops of dies 200 and TVs 306 that are higher than one ore more valleys which are located over recesses between dies 200 and TVs 306. The upper surface of dielectric layer 600 may vary a distance B, which is the vertical distance between a peak of the upper surface of dielectric layer 600 and a valley of the upper surface of dielectric layer 600. In some embodiments, distance B may be about 1 µm to about 10 µm, such as 6 µm.

Figure 7:
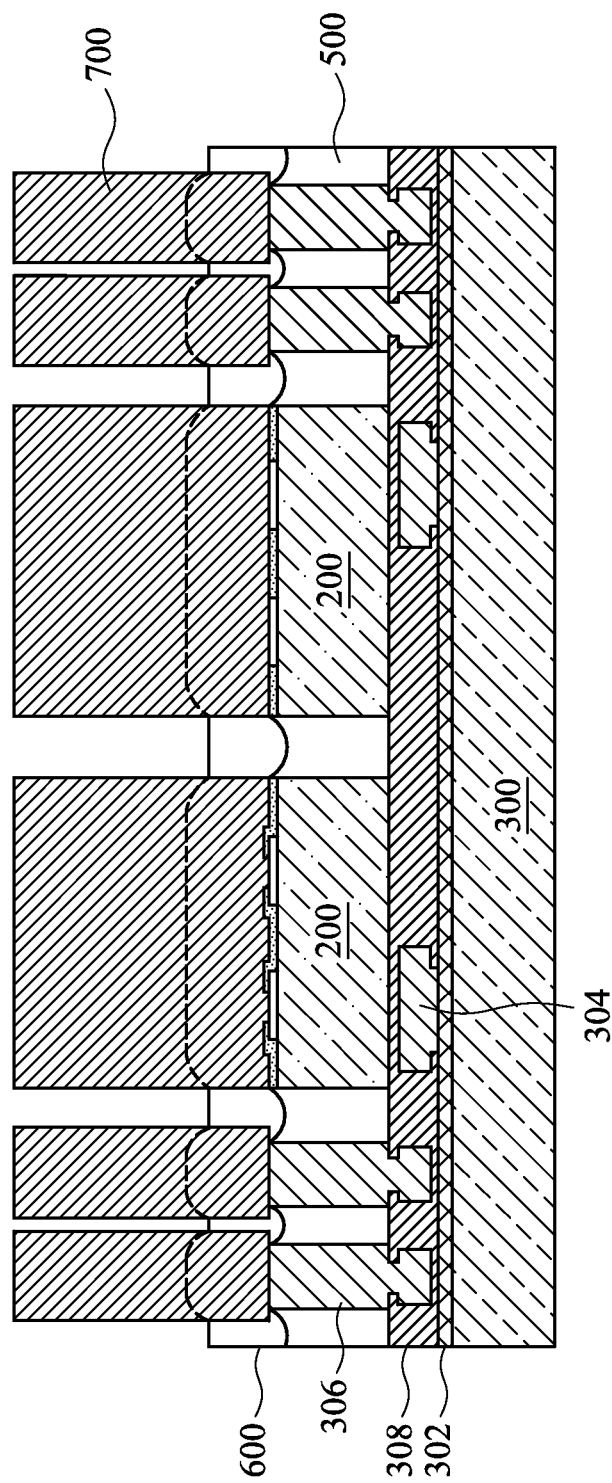
Figure 8:
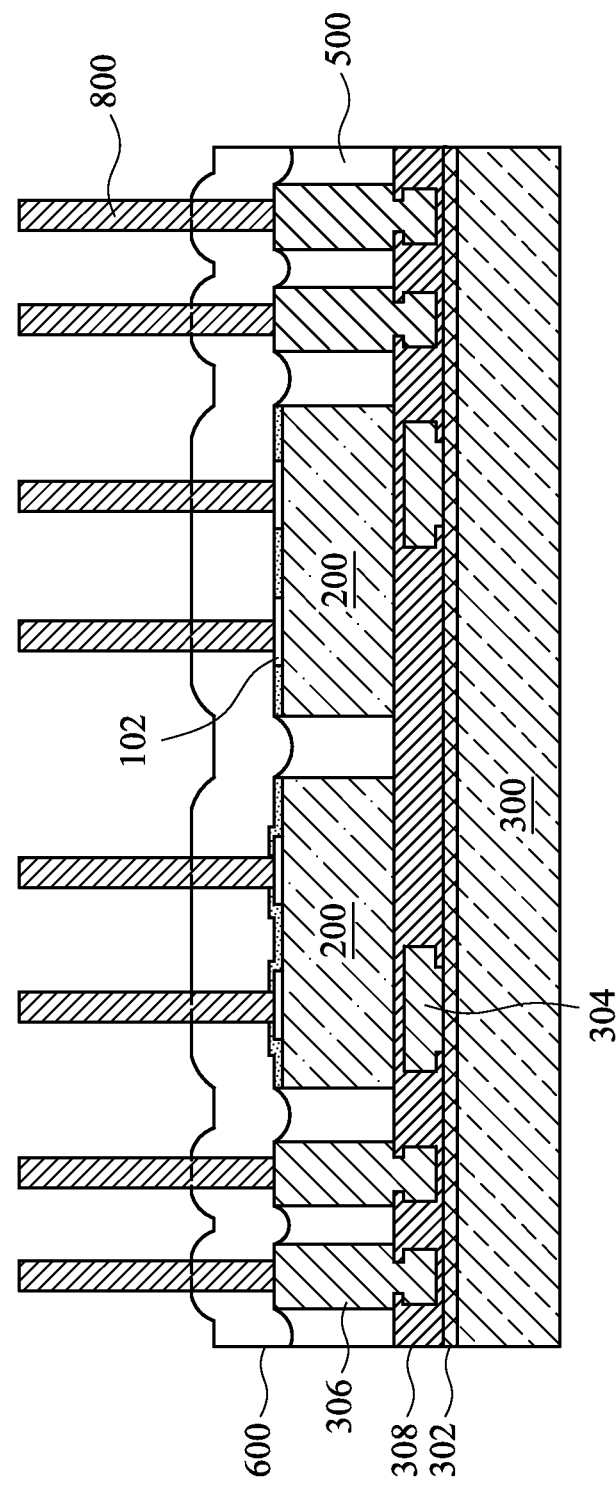

FIGS. 7 and 8 depict two exposure processes which are performed on dielectric layer 600 in accordance with some embodiments. In some embodiments, it may be desirable to perform a leveling process to reduce the variations in height of the upper surface of dielectric layer 600 to provide a more level surface upon which RDLs and/or devices may be placed. It may also be desirable to pattern dielectric layer 600 to expose contact pads 102 in order to form electrical connections to the contact pads 102. In some embodiments, the leveling and patterning to expose contact pads 102 and TVs 306 may be achieved by two exposure processes, such as those depicted in FIGS. 7 and 8, following by a developing process.

Referring to FIG. 7, in a first exposure process, a first exposure dose 700 of light is applied in a targeted manner to certain sections of dielectric layer 600. In this first exposure process, a goal is to reduce variations in height in the upper surface of dielectric layer 600. As such, the light is targeted towards those portions of dielectric layer 600 in which the upper surface is higher than other portions of dielectric layer 600, such as the portions of dielectric layer 600 which are located above a die 200 or a TV 306.

Referring to FIG. 8, in a second exposure process, a second exposure dose 800 of light is applied in a targeted manner to certain sections of dielectric layer 600. In this second exposure process, a goal is to pattern dielectric layer 600 to expose underlying contact pads and TVs 306. As such, the light is targeted towards those portions of dielectric layer 600 which overlie contact pads 102 and TVs 306.

The second exposure dose, used in the second exposure process, is generally higher than the first exposure dose, used in the first exposure process. In some embodiments, the first exposure process is performed before the second exposure process. In this case, if, for example, dielectric layer 600 comprises PBO having a thickness of about 17 µm, the first exposure dose may be about 100 mJ/cm$^2$ to about 500 mJ/cm$^2$, such as about 200 mJ/cm$^2$, and the second exposure dose may be about 650 mJ/cm$^2$ to about 1100 mJ/cm$^2$, such as about 850 mJ/cm$^2$. Alternatively, the second exposure process may be performed before the first exposure process. In this case, if, for example, dielectric layer 600 comprises PBO having a thickness of about 17 µm, the second exposure dose may be about 650 mJ/cm$^2$ to about 1100 mJ/cm$^2$, such as about 800 mJ/cm$^2$, and the first exposure dose may be about 100 mJ/cm$^2$ to about 500 mJ/cm$^2$, such as about 200 mJ/cm$^2$.

Figure 9:
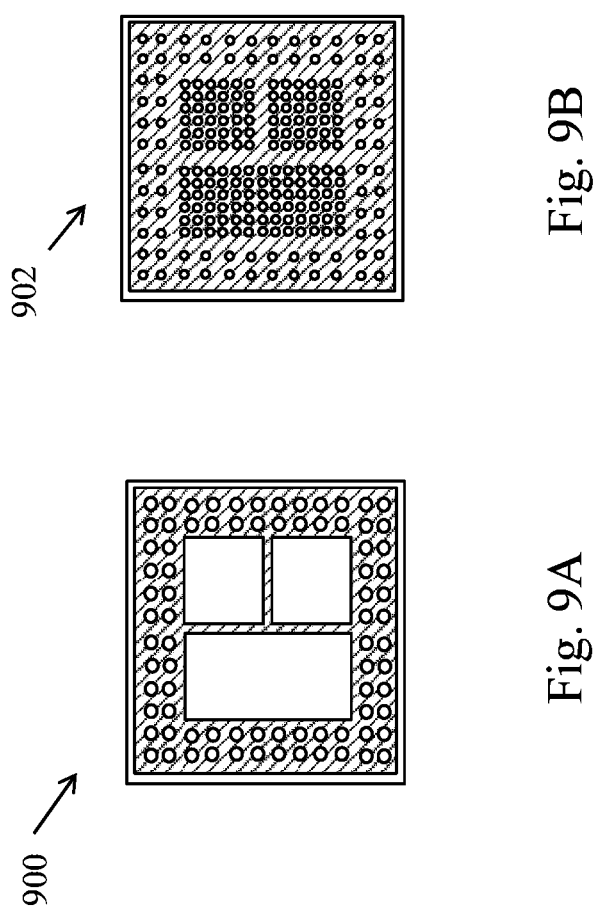
FIGS. 9A and 9B each show a plan view of mask layouts which can be used in photolithography processes in accordance with some embodiments.

Referring to FIGS. 9A and 9B, two exemplary exposure masks 900 and 902 are shown for use in the first exposure process and the second exposure process, respectively. For example, a mask, such as mask 900 or 902, may be placed above dielectric layer 600, and dielectric layer 600 may be exposed to light in the areas that are exposed to the light through the openings in the mask. Due to the selective application of light, after development dielectric layer 600 may be patterned according to the mask design and the intensity of the light.

In some embodiments, mask 900 may be suitable for use with the first exposure process described above. Mask 900 may have a plurality of larger openings and a plurality of smaller openings. The size of the openings in mask 900, and the number of openings in mask 900, is dependent upon the design of the underlying structure. Mask 900 has larger openings, which are designed for placement above dies 200, as well as smaller openings which are designed for placement above TVs 306. The size of the larger openings is dependent upon the size of dies 200. The size of the smaller openings is dependent upon the size of TVs 360. In some embodiments, the smaller openings may have a diameter of about 20 µm to about 200 µm, such as 90 µm. As described above, mask 900 may be effective in some embodiments when used with a first exposure dose of light to reduce variations in height of the top surface of dielectric layer 600.

In some embodiments, mask 902 may be suitable for use with the second exposure process described above. Mask 902 may have a plurality of openings of similar or identical size. The size of the openings in mask 902 may have a diameter of about 5 µm to about 50 µm. The number of openings in mask 902 is dependent on the underlying structure and the number of TVs 306 and contact pads 102 in the structure. The openings in mask 902 are designed so that, when mask 902 is placed above dielectric layer 600, an opening in mask 902 is placed over a desired area of electrical connection to either a TV 306 or a contact pad 102. Mask 902 may be effective in some embodiments when used with a second exposure dose to create openings in dielectric layer 600 to expose contact pads 102 and TVs 306.

Figure 10:
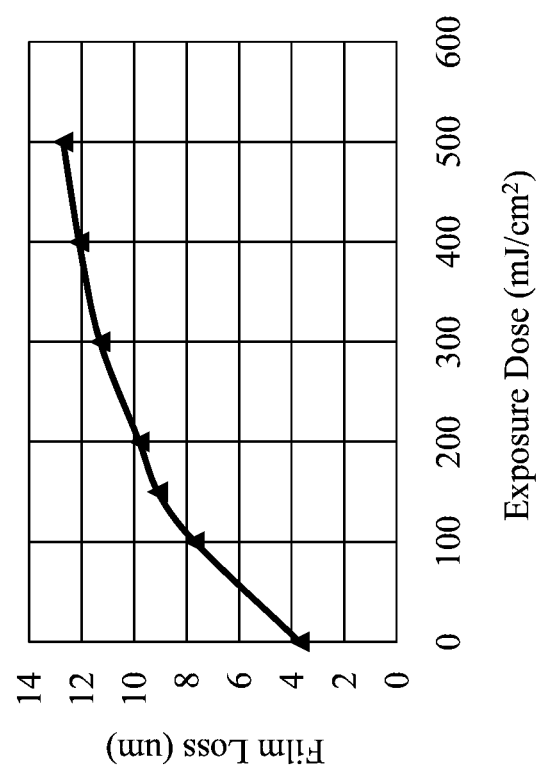
FIG. 10 depicts a relationship between film loss and exposure dose of a photolithography process in accordance with some embodiments.
Figure 11:
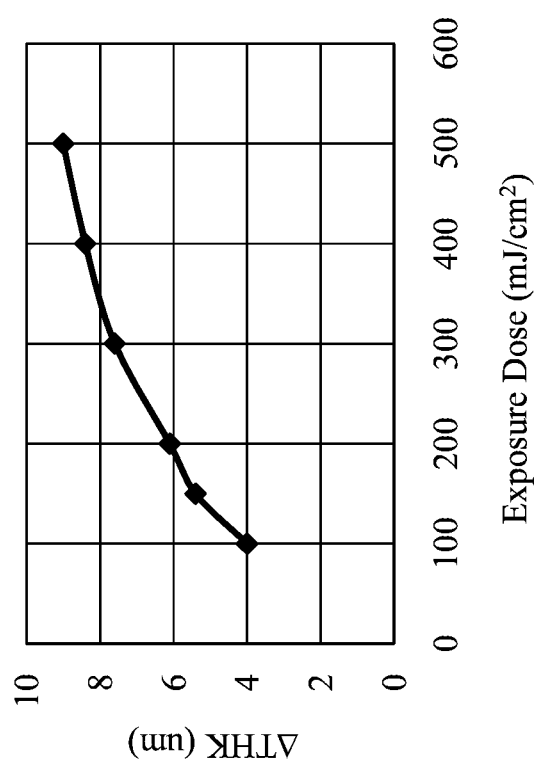
FIG. 11 depicts a relationship between a change in film thickness and exposure dose of a photolithography process in accordance with some embodiments.

FIGS. 10 and 11 depict relationships between exposure doses and film thickness or loss, and in some embodiments may be used to determine desired exposure doses of exposure processes for patterning dielectric layer 600 when dielectric layer 600 comprises PBO. FIG. 10 depicts the film loss that is created after development by exposing dielectric layer 600 to different exposure doses of light. FIG. 11 illustrates the difference in thickness that is created after development between areas of dielectric layer 600 that were exposed to light at different exposure doses and areas that were not exposed to light. FIG. 11 may be used to determine an optimal exposure dose for use with mask 900, to compensate for certain variations in height of the upper surface of dielectric layer 600. For example, if thickness B in FIG. 6, which shows the height of recesses in dielectric layer 600 created by recesses in the molding material 500, is about 6 µm, then according to FIG. 11, an exposure dose of 200 mJ/cm2 may compensate for the variations in height in the upper surface of dielectric layer 600 created by molding recesses below dielectric layer 600.

Figure 12:
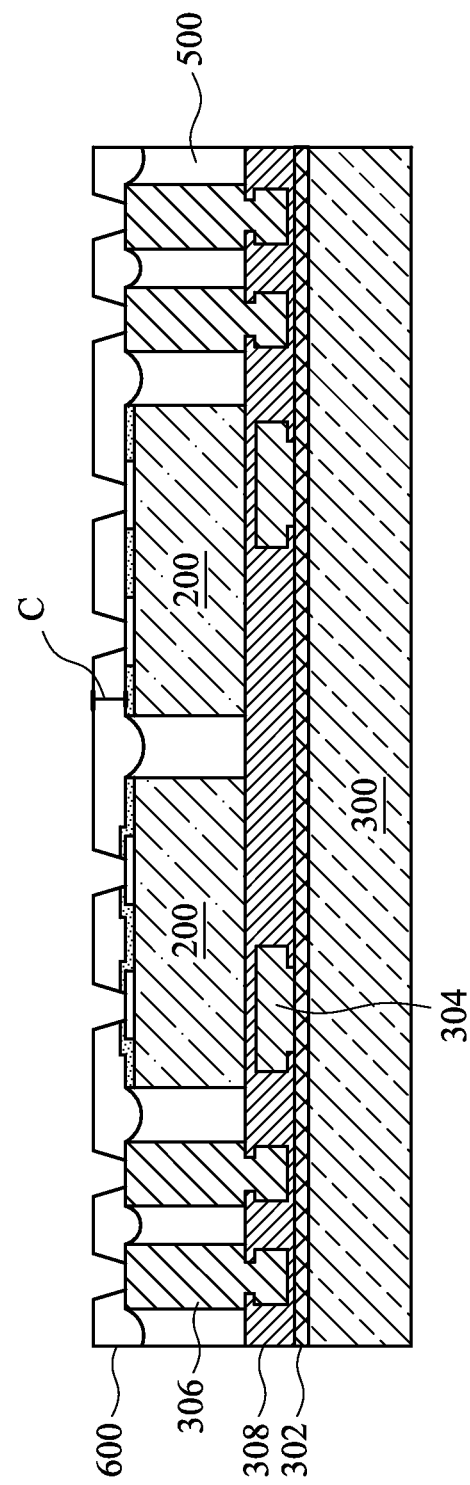
FIG. 12 is a cross section of an intermediate stage in the making of package structures in accordance with some embodiments.

In some embodiments, the above photolithography processing may reduce height variations in the upper surface of dielectric layer 600 and create openings in dielectric layer 600 to expose contact pads 102 and TVs 306. The resulting structure is shown in FIG. 12. As compared to FIG. 6, before the photolithography processing of dielectric layer 600, the dielectric layer 600 of FIG. 12 is reduced in thickness as a result of the developer on the unexposed portions. For example, in FIG. 12, thickness C may be about 3 µm to about 20 µm, such as 7 µm. The reduced thickness of dielectric layer 600 may enable an aspect ratio of the openings in dielectric layer 600 (opening height divided by opening diameter) to be about 1 to about 2, such as 1.74.

The photolithographic processing of dielectric layer 600, as described herein, may provide a cost effective alternative to prior methods of processing dielectric layer 600. For example, in prior methods, molding material and TVs may have been formed so they extended higher than the upper surfaces of contact pads 102. One or more grinding step(s) may have been performed to reduce the height of the TVs and the molding material so that it was planar and the same height as contact pads in the dies. One or more chemical mechanical polishing (CMP) step(s) may have also been performed. By processing dielectric layer using a series of exposure steps followed by a developing step, as described above, the grinding and CMP steps may be avoided or reduced, making the processing simpler and more cost effective. Additionally, a preferred aspect ratio of openings in dielectric layer 600 to expose underlying metal contacts may be achieved.

Figure 13:
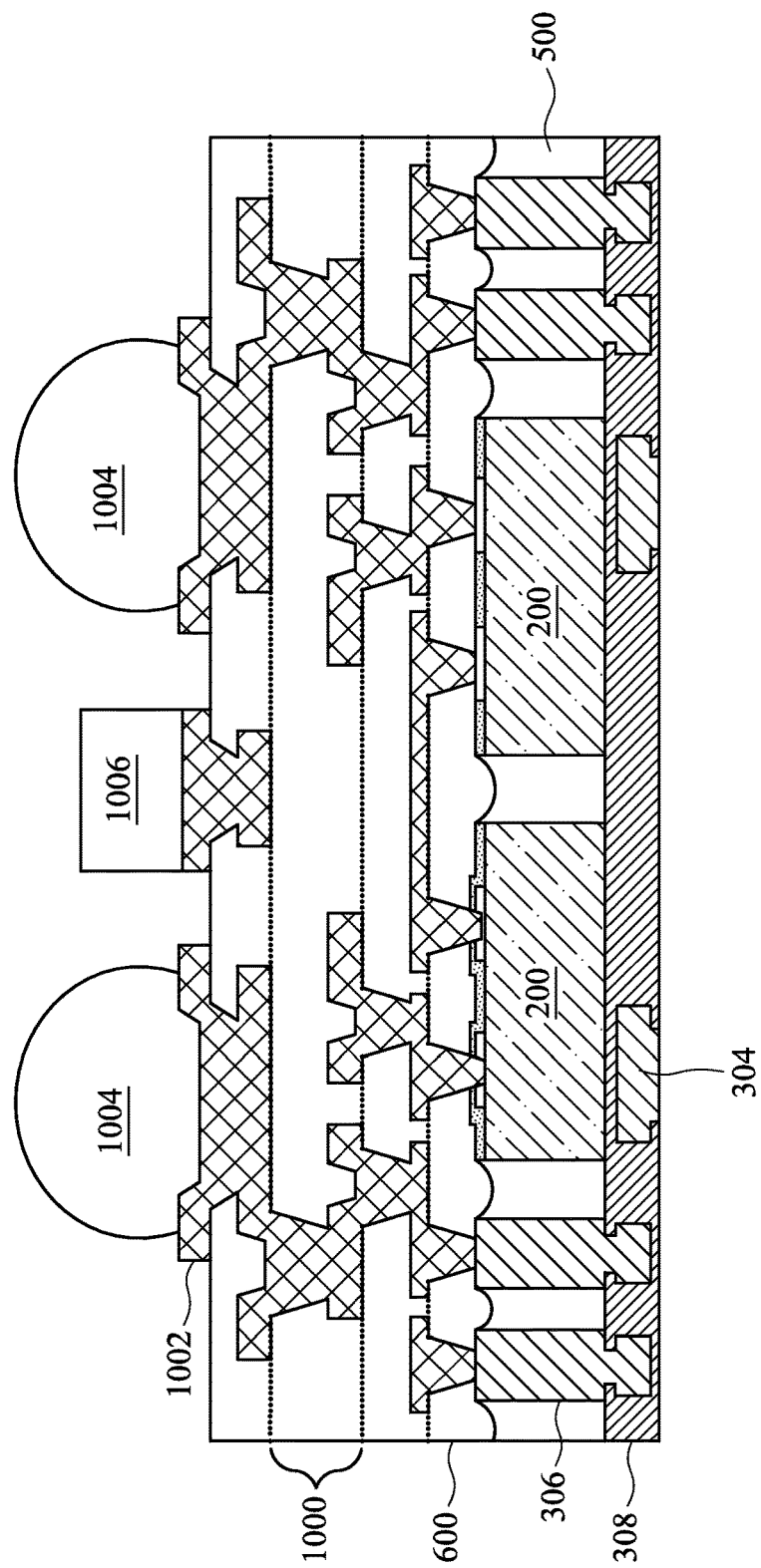
FIG. 13 is a cross section of a package structure in accordance with some embodiments.

Referring to FIG. 13, one or more layers of frontside RDLs is formed over dielectric layer 600. The frontside RDLs provide a conductive pattern that allows a pin-out contact pattern for a completed package different than the pattern of through vias 306 and/or contact pads 102, allowing for greater flexibility in the placement of through vias 306 and dies 200. The frontside RDLs may be utilized to provide an external electrical connection to dies 200 and/or to through vias 306. The frontside RDLs may further be used to electrically couple dies 200 to through vias 306, which may be electrically coupled to one or more other packages, package substrates, components, the like, or a combination thereof. The frontside RDLs may connect to the backside RDLs through TVs 306, which provide a connection between the front side and the backside of the package. The frontside RDLs comprise conductive lines and via connections, wherein via connections connect an overlying line (e.g., an overlying conductive line) to an underlying conductive feature (e.g., through vias 306, contact pads 102, and/or conductive lines). An example layer of frontside RDL is illustrated by RDL layer 1000 in FIG. 10. Conductive lines may extend along any direction, and into or out of the page. The frontside RDLs 1000 may be formed using any suitable process, such as those described above in connection with the frontside RDLs.

An under bump metallization (UBM) 1002 is formed and patterned over an uppermost metallization pattern in accordance with some embodiments, thereby forming an electrical connection with an uppermost metallization layer. The under bump metallization 1002 provides an electrical connection upon which an electrical connector, e.g., a solder ball/bump, a conductive pillar, or the like, may be placed. In an embodiment, the under bump metallization 1002 includes a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In an embodiment, under bump metallization 1002 is formed using sputtering. In other embodiments, electro plating may be used.

Connectors 1004 are formed over the under bump metallization 1002 in accordance with some embodiments. The connectors 1004 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 1004 may include a conductive material such as solder, copper, aluminum, gold, nickel, silver, palladium, tin, the like, or a combination thereof. In some embodiments, the connectors 1004 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 1004 may form a grid, such as a ball grid array (BGA). In some embodiments, a reflow process may be performed, giving the connectors 1004 a shape of a partial sphere in some embodiments. Alternatively, the connectors 1004 may comprise other shapes. The connectors 1004 may also comprise non-spherical conductive connectors, for example.

In some embodiments, the connectors 1004 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

One or more surface mounted devices 1006 may be attached to UBM 1002 instead of connectors 1004. Surface mounted devices 1006 may comprise any surface mounted device suitable for a particular approach, and may include active or passive devices, such as discrete devices, resistors, capacitors, transistors, packages, or the like.

As can be seen from FIG. 13, carrier substrate 300 has been de-bonded from the package. Release layer 302 has also been cleaned from the package, exposing the backside RDLs 308.

FIG. 13 depicts an InFO package that, compared to prior methods of forming, may be formed simply and cost-effectively. Photolithographic processing of dielectric layer 600, as described herein, may provide a cost effective alternative to prior methods of processing dielectric layer 600. For example, in prior methods, molding material and TVs may have been formed so they extended higher than contact pads 102. One or more grinding step(s) may have been performed to reduce the height of the TVs and the molding material so that it was planar and the same height as contact pads in the dies. One or more chemical mechanical polishing (CMP) step(s) may have also been performed. By processing dielectric layer using a series of exposure steps followed by development, as described above, the grinding and CMP steps may be avoided or reduced, making the processing simpler and more cost effective. Additionally, a preferred aspect ratio of openings in dielectric layer 600 may be achieved.

The embodiments illustrated above utilize two exposure processes to reduce variations in height in an upper surface of a dielectric layer. Other embodiments are possible. For example, more or fewer exposure processes are possible.

In some embodiments, a method of manufacturing a semiconductor device is provided. The method includes forming a through via on a substrate, the through via extending through a molding material. A dielectric layer is deposited over the through via and the molding material. A first exposure process is performed on a first area of the dielectric layer at a first exposure dose. A second exposure process is performed on a second area of the dielectric layer at a second exposure dose, a portion of the first area of the dielectric layer overlapping the second area of the dielectric layer. The dielectric layer is developed.

In some embodiments, a method of manufacturing a semiconductor device is provided. The method includes forming a through via on a substrate. A molding material is applied along sidewalls of the through via. A photosensitive layer is deposited over the through via and the molding material. The photosensitive layer has a first upper surface of the photosensitive layer with a first variation between a first peak of the first upper surface of the photosensitive layer and a first valley of the first upper surface of the photosensitive layer. The first peak is disposed over the through via and the first valley is disposed over the molding material. A first photolithography process is performed on the photosensitive layer at a first exposure dose. A second photolithography process is performed on the photosensitive layer at a second exposure dose. The second exposure dose is different from the first exposure does. The photosensitive layer is developed. After the developing, the first peak is reduced such that a second variation between the first peak after the developing and the first valley after the developing is less than the first variation, and the photosensitive layer has an opening that exposes the through via.

In some embodiments, a semiconductor device is provided. The semiconductor device includes a die having a contact pad and a first through via. A molding material is interposed between the die and the first through via, the molding material extending along sidewalls of the die and the through via.

A dielectric layer is disposed over the first through via and the die. Portions of the dielectric layer extend below top surfaces of the first through via and the die. A variation in height of an upper surface of the dielectric layer is less than a variation in height of a bottom surface of the dielectric layer. The dielectric layer has first opening over the first through via and a second opening over the contact pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a through via on a substrate;
   placing a die on the substrate;
   forming molding material extending along sidewalls of the die, the through via extending through the molding material;
   depositing a dielectric layer over the through via, the die, and the molding material, wherein an upper surface of the dielectric layer has a first variation in height between a first peak of the upper surface of the dielectric layer and a first valley of the upper surface of the dielectric layer, the first peak being disposed over the die and the first valley being disposed over the molding material;
   performing a first exposure process on a first area of the dielectric layer at a first exposure dose using a first mask;
   performing a second exposure process on a second area of the dielectric layer at a second exposure dose using a second mask, wherein a portion of the second area of the dielectric layer overlaps a portion of the first area of the dielectric layer; and
   developing the dielectric layer, wherein after the developing the upper surface of the developed dielectric layer has a second variation in height between a developed first peak of the upper surface of the dielectric layer and a developed first valley of the upper surface of the dielectric layer, the developed first peak being disposed over the die and the developed first valley being disposed over the molding material, and wherein the second variation in height is less than the first variation in height.

2. The method of claim 1, wherein the first exposure dose is lower than the second exposure dose and the first exposure process is performed before the second exposure process.

3. The method of claim 2, wherein the first exposure dose is about 100 mJ/cm$^2$ to about 500 mJ/cm$^2$, and the second exposure dose is about 650 mJ/cm$^2$ to about 1100 mJ/cm$^2$.

4. The method of claim 1, wherein the first exposure dose is lower than the second exposure dose and the first exposure process is performed after the second exposure process.

5. The method of claim 4, wherein the second exposure dose is about 650 mJ/cm$^2$ to about 1100 mJ/cm$^2$, and the first exposure dose is about 100 mJ/cm$^2$ to about 500 mJ/cm$^2$.

6. The method of claim 1, further comprising forming a redistribution line overlying the molding material and electrically connected to the through via through an opening in the dielectric layer.

7. The method of claim 1, wherein the portion of the second area of the dielectric layer that overlaps the portion of the first area of the dielectric layer is above the through via.

8. The method of claim 1, wherein the second area of the dielectric layer is smaller than the first area of the dielectric layer and the first area of the dielectric layer comprises the second area of the dielectric layer.

9. A method of forming a semiconductor device, the method comprising:
   forming a through via on a substrate;
   applying molding material along sidewalls of the through via;
   depositing a photosensitive layer over the through via and the molding material, the photosensitive layer having a first upper surface of the photosensitive layer having a first variation in height between a first peak of the first upper surface of the photosensitive layer and a first valley of the first upper surface of the photosensitive layer, the first peak being disposed over the through via and the first valley being disposed over the molding material;
   performing a first exposure process on the photosensitive layer at a first exposure dose;
   performing a second exposure process on the photosensitive layer at a second exposure dose, wherein the second exposure dose is different from the first exposure dose; and
   developing the photosensitive layer, wherein after the developing the first peak is reduced such that a second variation in height between the first peak after the developing and the first valley after the developing is less than the first variation in height, and the photosensitive layer has an opening that exposes the through via.

10. The method of claim 9, further comprising:
placing a die on the substrate, the molding material being interposed between the die and the through via;
wherein performing the first exposure process on the photosensitive layer comprises exposing a section of the photosensitive layer above the die, wherein an edge of the section of the photosensitive layer above the die is aligned with a sidewall of the die.

11. The method of claim 9, wherein the first exposure process uses a first mask having a first opening that exposes the photosensitive layer above a plurality of contact pads, and the second exposure process uses a second mask having a plurality of second openings, each of the second openings corresponding to a respective one of the plurality of contact pads.

12. The method of claim 9, wherein the photosensitive layer comprises polybenzoxazole, polyimide or benzocyclobutene.

13. A method of forming a semiconductor device, the method comprising:
forming a first through via on a substrate and a second through via on the substrate;
placing a die on the substrate, wherein the die has a first contact pad and a second contact pad, the die being interposed between the first through via and the second through via;
applying molding material along sidewalls of the first through via, the second through via, and the die;
depositing a photosensitive layer over the first through via, the second through via, the die, and the molding material;
performing a plurality of exposure processes on the photosensitive layer, wherein a first exposure process of the plurality of exposure processes exposes a first exposure area, wherein a second exposure process of the plurality of exposure processes exposes a second exposure area and a third exposure area, wherein the first exposure area overlaps the second exposure area and the third exposure area, and wherein an area of the photosensitive layer that overlies a section of molding material that is disposed between the die and the first through via is not comprised in the first exposure area, the second exposure area or the third exposure area; and
developing the photosensitive layer, wherein after developing the photosensitive layer has openings that expose the first contact pad and the second contact pad.

14. The method of claim 13, wherein the openings in the photosensitive layer have an aspect ratio of about 1 to about 2.

15. The method of claim 13, wherein the second exposure area is above the first contact pad and the third exposure area is above the second contact pad.

16. The method of claim 13, wherein the first exposure process further exposes a fourth exposure area, and wherein the second exposure process further exposes a fifth exposure area, wherein the fourth exposure area overlaps the fifth exposure area, and wherein the fourth exposure area and the fifth exposure area corresponds to the first through via.

17. The method of claim 13, wherein the second exposure process is performed before the first exposure process.

18. The method of claim 13, further comprising forming one or more frontside redistribution layers over the photosensitive layer, wherein the frontside redistribution layers provide an external connection to the first through via, the second through via, or the die.

19. The method of claim 1, wherein after the developing a first opening extends through the dielectric layer to expose the through via.

20. The method of claim 19, wherein after the developing a second opening extends through the dielectric layer to expose a portion of the die.

* * * * *